(12) United States Patent
Morikawa et al.

(10) Patent No.: US 7,902,568 B2
(45) Date of Patent: Mar. 8, 2011

(54) LIGHT-EMITTING MODULE WITH PLURAL LIGHT EMITTERS AND CONDUCTOR PATTERN

(75) Inventors: Makoto Morikawa, Nara (JP); Takaari Uemoto, Osaka (JP); Keiji Nishimoto, Osaka (JP); Satoshi Shida, Osaka (JP); Yasuharu Ueno, Osaka (JP); Hiroyuki Naito, Osaka (JP)

(73) Assignee: Panasonic Corporation, Osaka (JP)

( * ) Notice: Subject to any disclaimer, the term of this patent is extended or adjusted under 35 U.S.C. 154(b) by 603 days.

(21) Appl. No.: 11/993,729

(22) PCT Filed: Jul. 10, 2006

(86) PCT No.: PCT/JP2006/314118
§ 371 (c)(1), (2), (4) Date: Dec. 21, 2007

(87) PCT Pub. No.: WO2007/010879
PCT Pub. Date: Jan. 25, 2007

(65) Prior Publication Data
US 2010/0079997 A1    Apr. 1, 2010

(30) Foreign Application Priority Data
Jul. 15, 2005   (JP) .................. 2005-207352

(51) Int. Cl.
*H01L 33/00* (2010.01)
(52) U.S. Cl. .................. 257/100; 362/249.06
(58) Field of Classification Search .................. 257/100; 362/249.06, 249.14
See application file for complete search history.

(56) References Cited

U.S. PATENT DOCUMENTS
2004/0022057 A1 * 2/2004 Lee .............. 362/238
2005/0133811 A1   6/2005 Han et al.

FOREIGN PATENT DOCUMENTS
| FR | 2 707 222 | 1/1995 |
| JP | 10-62786 | 3/1998 |
| JP | 2002-373508 | 12/2002 |
| WO | 02/31794 | 4/2002 |

* cited by examiner

*Primary Examiner* — Thomas L Dickey
(74) *Attorney, Agent, or Firm* — Hamre, Schumann, Mueller & Larson, P.C.

(57) ABSTRACT

A light-emitting module (2) includes a mounting board (1) with a conductor pattern and a plurality of light-emitting elements (15) mounted on the conductor pattern via wires (21). The extending direction of each of the wires (21) toward the conductor pattern is oriented irregularly when viewed perpendicularly to the mounting board (1). This can prevent the shadows of the wires (21) from overlapping, and thus can suppress the luminance nonuniformity.

5 Claims, 8 Drawing Sheets

LIGHT-EMITTING MODULE WITH PLURAL LIGHT EMITTERS AND CONDUCTOR PATTERN

TECHNICAL FIELD

The present invention relates to a light-emitting module including light-emitting elements, and a mounting board used for the light-emitting module.

BACKGROUND ART

A light-emitting element such as a light emitting diode (referred to as "LED" in the following) or semiconductor laser has been used, e.g., as a light source for a liquid crystal backlight, an indicator, a display, and a read sensor.

For example, JP 10(1998)-62786 A discloses the invention that relates to a LED light source in which a plurality of LED chips are connected in series via wires. FIG. 9A is a schematic perspective view of the LED light source of JP 10(1998)-62786 A, and FIG. 9B is a perspective plan view of the same.

In the LED light source 100 of FIG. 9A, conductor patterns 102 are formed on a base material 101, and a plurality of LED chips 103 are die-bonded to the conductor patterns 102 and connected in series via wires 104.

However, as shown in FIG. 9B, each of the wires 104 extends from the LED chip 103 to the conductor pattern 102 in the same direction when viewed perpendicularly to the base material 101. Therefore, shadows of the wires 104 overlap while light emitted from each of the LED chips 103 is condensed by a condenser lens. As a result, luminance nonuniformity is likely to occur on an irradiation plane.

DISCLOSURE OF INVENTION

With the foregoing in mind, the present invention provides a light-emitting module that can suppress the luminance nonuniformity caused by the shadows of wires, and a mounting board used for the light-emitting module.

A light-emitting module of the present invention includes a mounting board with a conductor pattern and a plurality of light-emitting elements mounted on the conductor pattern via wires. The extending direction of each of the wires toward the conductor pattern is oriented irregularly when viewed perpendicularly to the mounting board.

A mounting board of the present invention is used for mounting a plurality of light-emitting elements with a substantially square or rectangular shape by wire bonding. The mounting board includes a conductor pattern that includes a plurality of mount portions carrying the light-emitting elements. When the light-emitting element is mounted on the mount portion and viewed perpendicularly to the mounting board, the mount portion has peripheral portions that are located outside of each side of the light-emitting element.

DESCRIPTION OF THE INVENTION

Figure 1A:
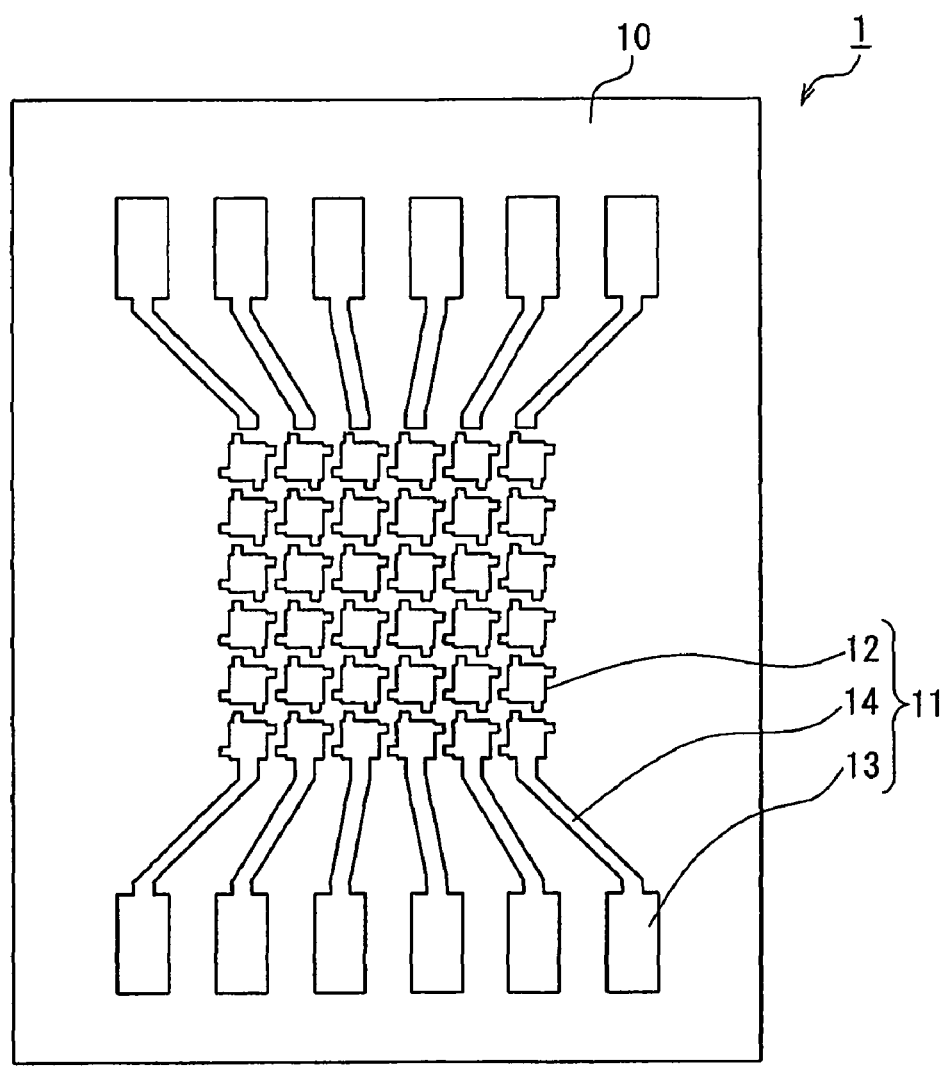
FIG. 1A is a plan view of a mounting board of Embodiment 1 of the present invention.

A light-emitting module of the present invention includes a mounting board with a conductor pattern and a plurality of light-emitting elements mounted on the conductor pattern via wires.

The mounting board includes, e.g., a base material and the conductor pattern formed on the base material. The base material is not particularly limited and may be a ceramic material such as $Al_2O_3$ or AlN, a semiconductor material such as Si, or a laminated material in which an electric insulating layer is formed on a metal layer. As the electric insulating layer, e.g., a composite material including 50 to 95 mass % of inorganic filler and 5 to 50 mass % of thermosetting resin composition can be used. The material of the wire also is not particularly limited, and a wire made of metal such as a gold wire can be used. The wire diameter is preferably 30 μm or less because the area of a shadow of the wire can be reduced to suppress the luminance nonuniformity. In general, the wire diameter is 15 μm or more.

The light-emitting element may be, e.g., a red LED chip for emitting red light with a wavelength of 590 to 650 nm, a green LED chip for emitting green light with a wavelength of 500 to 550 nm, or a blue LED chip for emitting blue light with a wavelength of 450 to 500 nm. The red LED chip may be made of a AlInGaP material, and the green or blue LED chip may be made of a InGaAlN material. The number of the light-emitting elements is not particularly limited and may be determined appropriately in accordance with the luminous energy to be required or the like.

When the light-emitting module of the present invention is used as a white light source, it may include the blue LED chips as the light-emitting elements. Moreover, the light-emitting elements may be covered with a phosphor layer that emits fluorescence by absorption of light emitted from the light-emitting elements. For example, the phosphor layer can be formed by producing a paste in which a phosphor that absorbs light emitted from the light-emitting elements and emits fluorescence is dispersed in a silicone resin or the like and applying the paste to the light-emitting elements.

Examples of the phosphor include a green light emitting phosphor such as $Y_3(Al, Ga)_5O_{12}:Ce^{3+}$ with a garnet structure or silicate $(Ba, Sr)_2SiO_4:Eu^{2+}$, a yellow light emitting phosphor such as SIALON Ca—Al—Si—O—N:$Eu^{2+}$, silicate $(Sr, Ca)_2SiO_4:Eu^{2+}$, or $(Y, Gd)_3Al_5O_{12}:Ce^{3+}$ with a garnet structure, and a red light emitting phosphor such as nitridosilicate $Sr_2Si_5N_8:Eu^{2+}$, nitridoaluminosilicate $CaAlSiN_3:Eu^{2+}$, oxo-nitridoaluminosilicate $Sr_2Si_4AlON_7:Eu^{2+}$, or sulfide $CaS:Eu^{2+}$.

In the light-emitting module of the present invention, the extending direction of each of the wires toward the conductor pattern is oriented irregularly when viewed perpendicularly to the mounting board. This can prevent the shadows of the wires from overlapping, and thus can suppress the luminance nonuniformity. In the context of the present invention, the definition that "the extending direction is oriented irregularly" indicates that the wires extend irregularly in the light-emitting module as a whole, and some of the wires may extend regularly in a part of the light-emitting module. For example, when the light-emitting module of the present invention includes a plurality of light-emitting units that are arranged in parallel on the mounting board, and each of the light-emitting units includes the light-emitting elements connected in series via the wires and the conductor pattern, the adjacent light-emitting units may differ in the extending direction of each of the wires. In this case, all the wires in the same light-emitting unit may extend in the same direction. Such a configuration facilitates the mounting process of the light-emitting elements with the wires during formation of the light-emitting unit.

In the light-emitting module of the present invention, the wires used for mounting each of the adjacent light-emitting elements may extend in different directions. This can prevent the overlapping of the shadows of the wires more effectively.

In the light-emitting module of the present invention, each of the wires may extend from the edge of the light-emitting element to the conductor pattern when viewed perpendicularly to the mounting board. This reduces a region where the wire overlaps the luminous surface of the light-emitting element, so that the area of a shadow of the wire can be reduced to suppress the luminance nonuniformity. In this case, the "edge" may range from one side of the light-emitting element to a position that is 0.4 L inward, and preferably 0.3 L inward from the side, where L represents the length of the side.

The light-emitting module of the present invention further may include a plurality of sub-mount substrates, on each of which the light-emitting element is mounted. The sub-mount substrates may be mounted on the conductor pattern via the wires. With this configuration, the electrical or optical properties of the light-emitting elements can be inspected at the time the light-emitting elements are mounted on the sub-mount substrates. Therefore, only non-defective light-emitting elements can be selected and mounted. Thus, it is possible to avoid waste in the manufacturing process of the light-emitting module and improve yields. The material of the sub-mount substrate is not particularly limited, and the same materials as those for the mounting board can be used.

Next, a mounting board of the present invention will be described below. The mounting board is suitable for the above light-emitting module of the present invention. Therefore, the explanation that overlaps with that of the light-emitting module may be omitted in the following.

The mounting board of the present invention is used for mounting a plurality of light-emitting elements with a substantially square or rectangular shape by wire bonding. The mounting board includes a conductor pattern that includes a plurality of mount portions carrying the light-emitting elements. When the light-emitting element is mounted on the mount portion and viewed perpendicularly to the mounting board, the mount portion has peripheral portions that are located outside of each side of the light-emitting element. Since the peripheral portions can serve as connection terminals of the wires, the wire is allowed to extend in any direction of the four sides of the light-emitting element. Thus, the mounting board can make it easier to produce the light-emitting module of the present invention.

In the mounting board of the present invention, it is preferable that the area of each of the peripheral portions is 0.001 to 0.250 $mm^2$. With this range, the bonding can be performed easily using the wires without reducing the packaging density of the light-emitting elements.

Hereinafter, embodiments of the present invention will be described in detail.

Embodiment 1

Figure 1B:
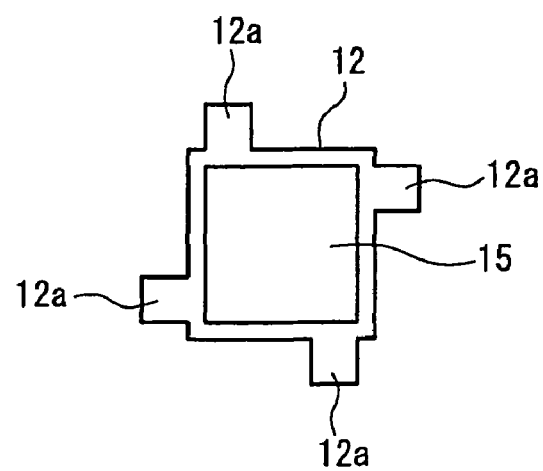
FIG. 1B is a plan view of a mount portion included in the mounting board of FIG. 1A, on which a LED chip is mounted.

A mounting board of Embodiment 1 of the present invention will be described by referring to the drawings. FIG. 1A is a plan view of the mounting board of Embodiment 1. FIG. 1B is a plan view of a mount portion included in the mounting board of FIG. 1A, on which a LED chip is mounted.

As shown in FIG. 1A, the mounting board 1 of Embodiment 1 includes a base material 10 and a conductor pattern 11 formed on the base material 10. The conductor pattern 11 includes a plurality of mount portions 12, a plurality of external connection terminals 13, and a plurality of lead portions 14 for connecting the mount portion 12 and the external connection terminals 13.

As shown in FIG. 1B, the mount portion 12 has four peripheral portions 12a. When a substantially square LED chip 15 is mounted on the mount portion 12 and viewed perpendicularly to the mounting board 1, the peripheral portions 12a are located outside of each side of the LED chip 15 (see FIG. 1B). Thus, the peripheral portions 12a also can serve as connection terminals of wires 21 (see FIG. 2A). This allows the wire 21 to extend in any direction of the four sides of the LED chip 15. The area of each of the peripheral portions 12a is preferably 0.001 to 0.250 $mm^2$, and more preferably 0.0025 to 0.225 $mm^2$. With this range, the bonding can be performed easily using the wires 21 without reducing the packaging density of the LED chips 15.

Embodiment 2

Figure 2A:
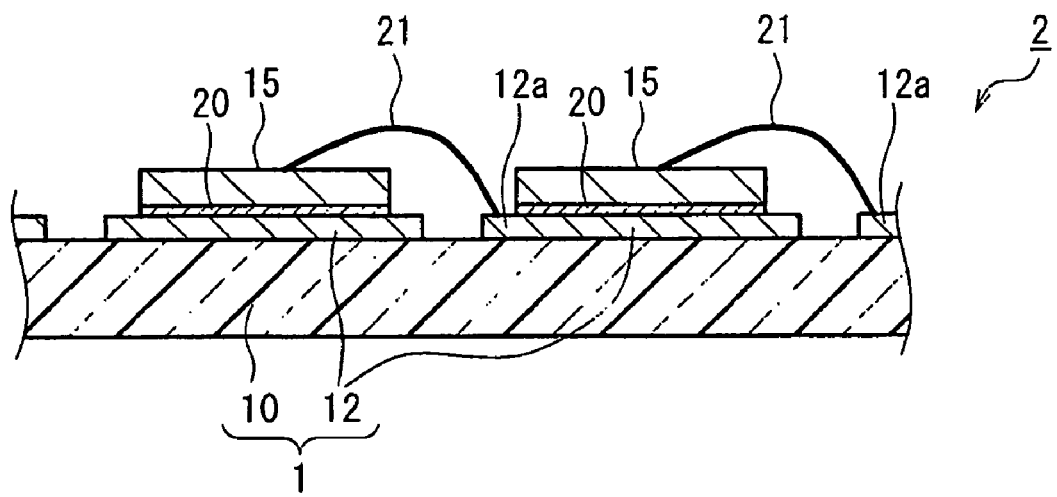
FIG. 2A is a cross-sectional view of a light-emitting module of Embodiment 2 of the present invention.
Figure 2B:
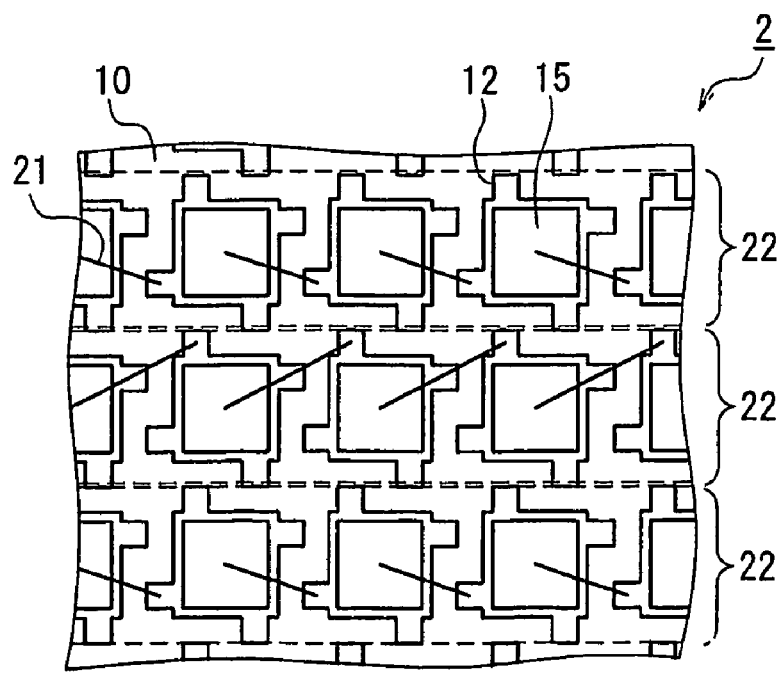
FIG. 2B is a plan view of the light-emitting module of Embodiment 2, as viewed perpendicularly to a mounting board.

A light-emitting module of Embodiment 2 of the present invention will be described by referring to the drawings. FIG. 2A is a cross-sectional view of the light-emitting module of Embodiment 2. FIG. 2B is a plan view of the light-emitting module of Embodiment 2, as viewed perpendicularly to a mounting board. The light-emitting module of Embodiment 2 uses the mounting board 1 of Embodiment 1. In FIGS. 2A and 2B, the same components as those in FIGS. 1A and 1B are denoted by the same reference numerals, and the explanation will not be repeated.

As shown in FIG. 2A, the light-emitting module 2 of Embodiment 2 includes the mounting board 1 and the LED chips 15. The LED chips 15 are die-bonded to each of the mount portions 12 of the mounting board 1 via a conductive adhesive layer 20 made of, e.g., a silver paste. The LED chips 15 are connected in series through the wires 21, the mount portions 12, and the conductive adhesive layers 20. For example, an electrode (not shown) formed on the upper surface of the LED chip 15 and any of the peripheral portions 12a may be connected by the wire 21.

As shown in FIG. 2B, the LED chips 15 connected in series constitute LED chip units 22 that become longer in the lateral direction of the drawing, and the LED chip units 22 are arranged in parallel on the base material 10. Moreover, the adjacent LED chip units 22 differ in the extending direction of each of the wires 21 toward the mount portions 12. This can prevent the shadows of the wires 21 from overlapping, and thus can suppress the luminance nonuniformity.

In the light-emitting module 2, all the wires 21 in the same LED chip unit 22 extend in the same direction. Such a configuration facilitates the mounting process of the LED chips 15 with the wires 21 during formation of the LED chip unit 22.

The light-emitting module of an embodiment has been described, but the present invention is not limited thereto. For example, although all the wires in the same LED chip unit extend in the same direction in the above embodiment, at least one wire may extend in a different direction from the other wires in the same LED chip unit.

Embodiment 3

Figure 3:
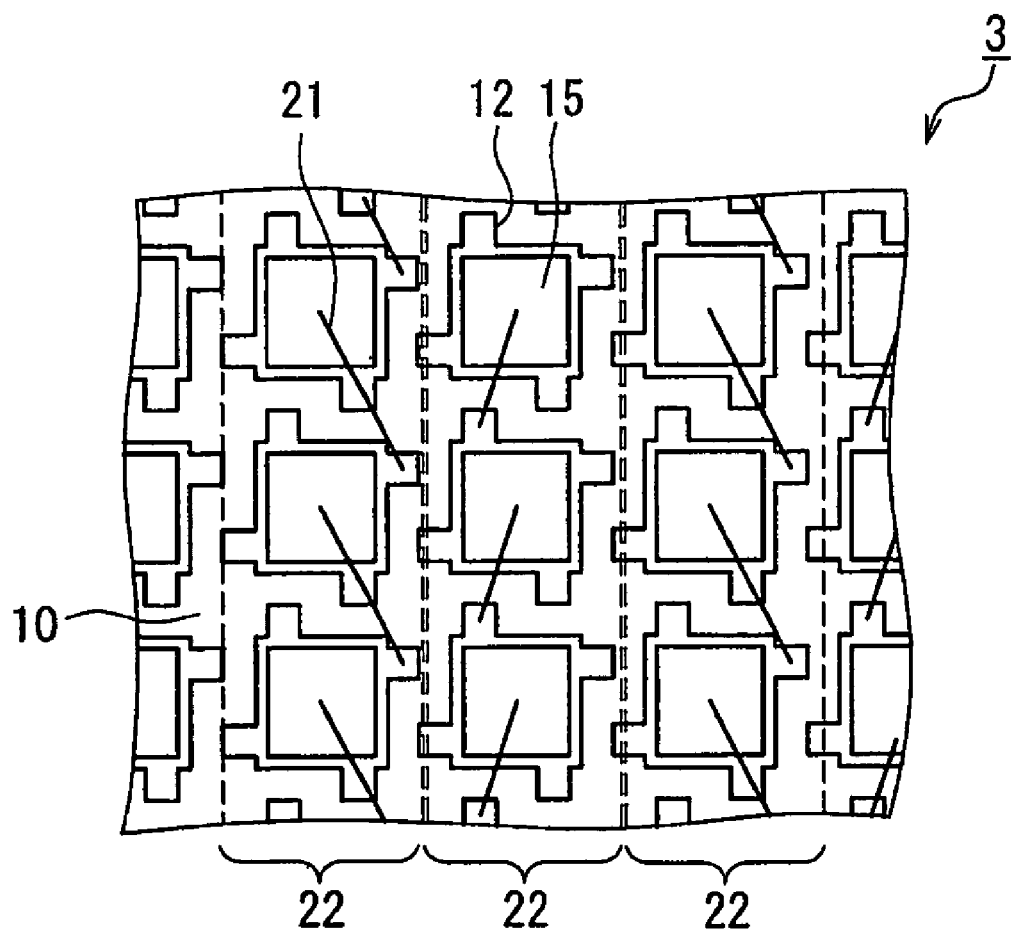
FIG. 3 is a plan view of a light-emitting module of Embodiment 3 of the present invention, as viewed perpendicularly to a mounting board.

A light-emitting module of Embodiment 3 of the present invention will be described by referring to the drawings. FIG. 3 is a plan view of the light-emitting module of Embodiment 3, as viewed perpendicularly to a mounting board. In FIG. 3, the same components as those in FIGS. 2A and 2B are denoted by the same reference numerals, and the explanation will not be repeated.

As shown in FIG. 3, the light-emitting module 3 of Embodiment 3 includes the LED chip units 22 that become longer in the vertical direction of the drawing. In other words, the individual LED chip units 22 are composed of the LED chips 15 connected in series in the vertical direction of the drawing. The other configurations of the light-emitting module 3 are the same as those of the light-emitting module 2. Thus, the light-emitting module 3 also can have an effect comparable to that of the light-emitting module 2.

Embodiment 4

Figure 4A:
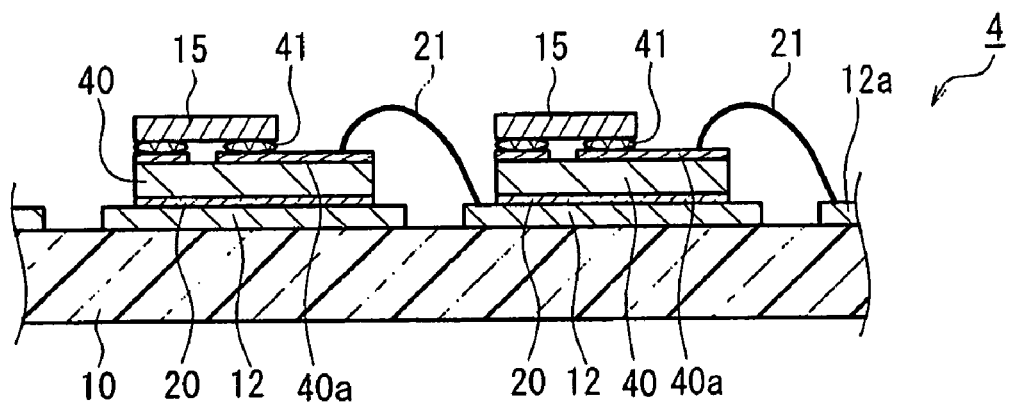
FIG. 4A is a cross-sectional view of a light-emitting module of Embodiment 4 of the present invention.
Figure 4B:
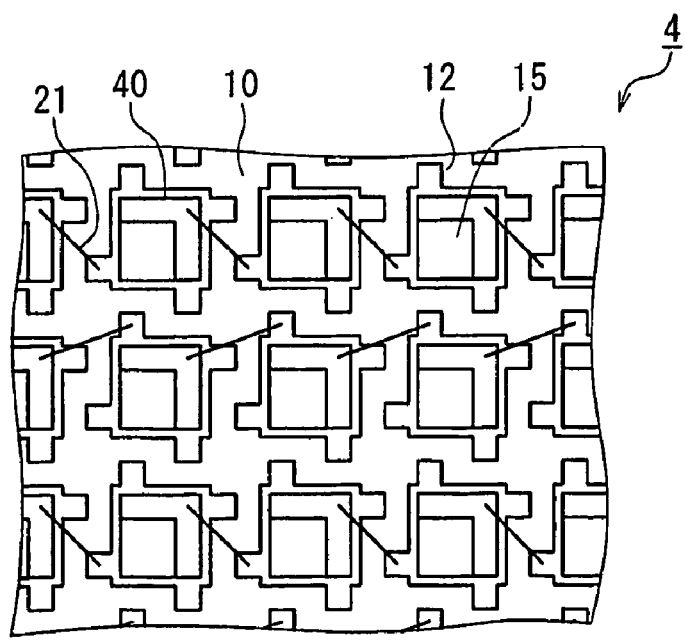
FIG. 4B is a plan view of the light-emitting module of Embodiment 4, as viewed perpendicularly to a mounting board.

A light-emitting module of Embodiment 4 of the present invention will be described by referring to the drawings. FIG. 4A is a cross-sectional view of the light-emitting module of Embodiment 4. FIG. 4B is a plan view of the light-emitting module of Embodiment 4, as viewed perpendicularly to a mounting board. In FIGS. 4A and 4B, the same components as those in FIGS. 2A and 2B are denoted by the same reference numerals, and the explanation will not be repeated.

As shown in FIG. 4A, the light-emitting module 4 of Embodiment 4 includes sub-mount substrates 40 that are die-bonded to each of the mount portions 12 via the conductive adhesive layer 20 made of, e.g., a silver paste. Conductor patterns 40a are formed on the sub-mount substrates 40, and the LED chips 15 are flip-chip mounted on the conductor patterns 40a via bumps 41. The adjacent sub-mount substrates 40 are connected electrically through the wires 21, the mount portions 12, and the conductive adhesive layers 20, as shown in FIGS. 4A and 4B. In the light-emitting module 4, the electrical or optical properties of the LED chips 15 can be inspected at the time the LED chips 15 are mounted on the sub-mount substrates 40. Therefore, only non-defective LED chips 15 can be selected and mounted.

As shown in FIG. 4B, no wire 21 extends across the luminous surface of the LED chip 15. Thus, the light-emitting module 4 can suppress the luminance nonuniformity more effectively. The other configurations of the light-emitting module 4 are the same as those of the light-emitting module 2.

Embodiment 5

Figure 5A:
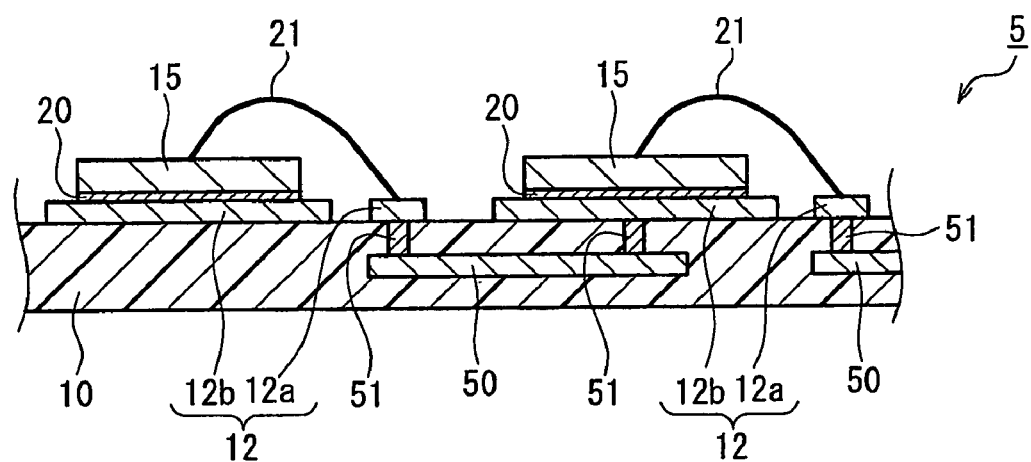
FIG. 5A is a cross-sectional view of a light-emitting module of Embodiment 5 of the present invention.
Figure 5B:
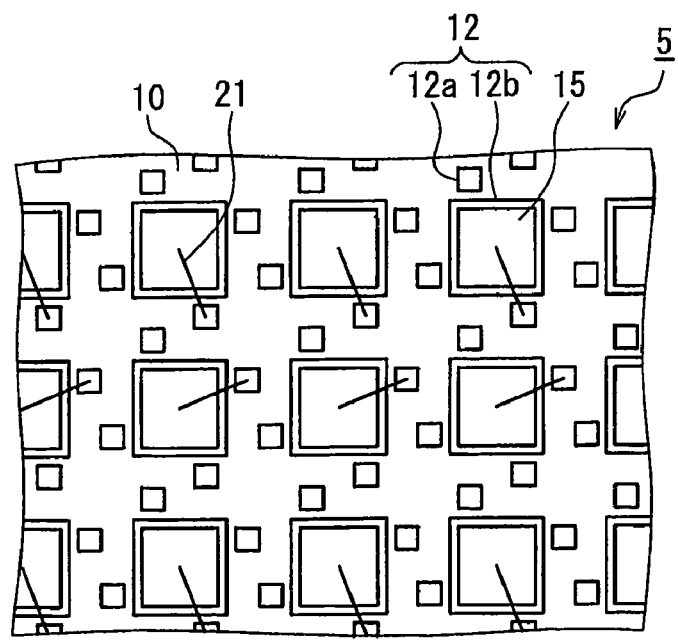
FIG. 5B is a plan view of the light-emitting module of Embodiment 5, as viewed perpendicularly to a mounting board.

A light-emitting module of Embodiment 5 of the present invention will be described by referring to the drawings. FIG. 5A is a cross-sectional view of the light-emitting module of Embodiment 5. FIG. 5B is a plan view of the light-emitting module of Embodiment 5, as viewed perpendicularly to a mounting board. In FIGS. 5A and 5B, the same components as those in FIGS. 2A and 2B are denoted by the same reference numerals, and the explanation will not be repeated.

As shown in FIG. 5A, the light-emitting module 5 of Embodiment 5 includes wiring patterns 50 and via conductors 51 that are provided inside the base material 10. In each of the mount portions 12 of the light-emitting module 5, the peripheral portions 12a are separated from a central portion 12b on which the LED chip 15 is mounted. The adjacent LED chips 15 are connected electrically through the wires 21, the peripheral portions 12a of the mount portions 12, the via conductors 51, the wiring patterns 50, the via conductors 51, the central portions 12b of the mount portions 12, and the conductive adhesive layers 20. Therefore, when the LED chip 15 is mounted by the wire 21, any of the peripheral portions 12a of the mount portion 12 that carries this LED chip 15 can be used as a connection terminal. Consequently, the length of the wires 21 can be made shorter in the light-emitting module 5 (see FIG. 5B) than in the light-emitting module 2 (see FIG. 2B), thereby improving the reliability of electric connection with the wires 21. The other configurations of the light-emitting module 5 are the same as those of the light-emitting module 2. Thus, the light-emitting module 5 also can have an effect comparable to that of the light-emitting module 2.

Embodiment 6

Figure 6:
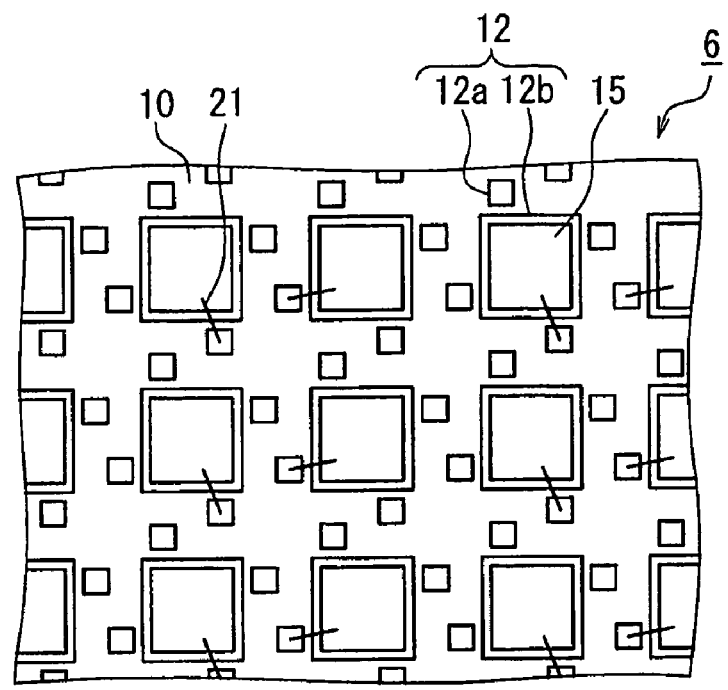
FIG. 6 is a plan view of a light-emitting module of Embodiment 6 of the present invention, as viewed perpendicularly to a mounting board.

A light-emitting module of Embodiment 6 of the present invention will be described by referring to the drawings. FIG. 6 is a plan view of the light-emitting module of Embodiment 6, as viewed perpendicularly to a mounting board. In FIG. 6, the same components as those in FIGS. 5A and 5B are denoted by the same reference numerals, and the explanation will not be repeated.

As shown in FIG. 6, the light-emitting module 6 of Embodiment 6 includes the LED chips 15 that are connected in series in the vertical direction of the drawing. Moreover, each of the wires 21 extends from the edge of the LED chip 15 to the peripheral portion 12a. Consequently, the length of the wires 21 can be made shorter in the light-emitting module 6 than in the light-emitting module 5 (see FIG. 5B). The light-emitting module 6 reduces a region where the wire 21 overlaps the luminous surface of the LED chip 15, so that the area of a shadow of the wire 21 can be reduced to suppress the luminance nonuniformity. The other configurations of the light-emitting module 6 are the same as those of the light-emitting module 5. Thus, the light-emitting module 6 also can have an effect comparable to that of the light-emitting module 5.

Embodiment 7

Figure 7:
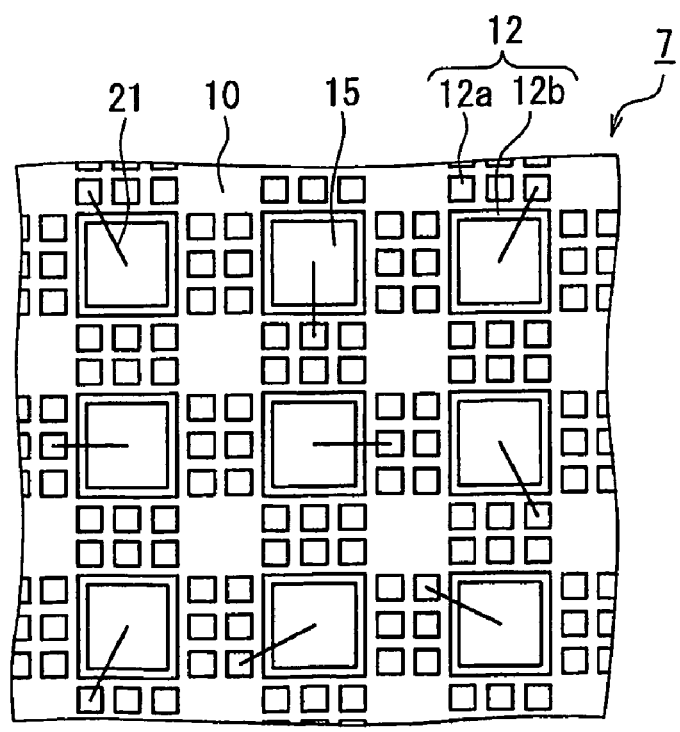
FIG. 7 is a plan view of a light-emitting module of Embodiment 7 of the present invention, as viewed perpendicularly to a mounting board.

A light-emitting module of Embodiment 7 of the present invention will be described by referring to the drawings. FIG. 7 is a plan view of the light-emitting module of Embodiment 7, as viewed perpendicularly to a mounting board. In FIG. 7, the same components as those in FIGS. 5A and 5B are denoted by the same reference numerals, and the explanation will not be repeated.

As shown in FIG. 7, the light-emitting module 7 of Embodiment 7 includes three peripheral portions 12a for each side of the central portion 12b. In the light-emitting module 7, the wires 21 used for mounting each of the adjacent LED chips 15 extend in different directions. This can prevent the overlapping of the shadows of the wires 21 more effectively. The other configurations of the light-emitting module 7 are the same as those of the light-emitting module 5.

Embodiment 8

Figure 8A:
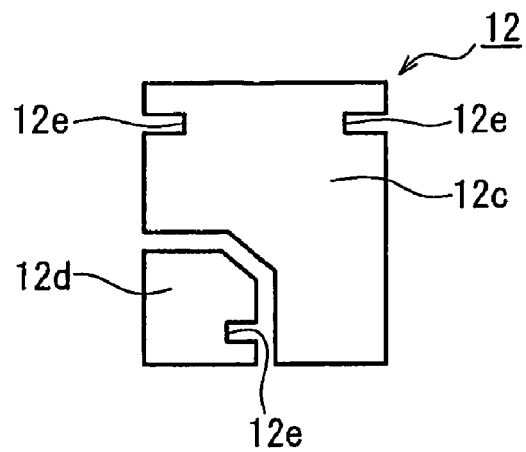
FIG. 8A is a plan view of a mount portion included in a light-emitting module of Embodiment 8 of the present invention.
Figure 8B:
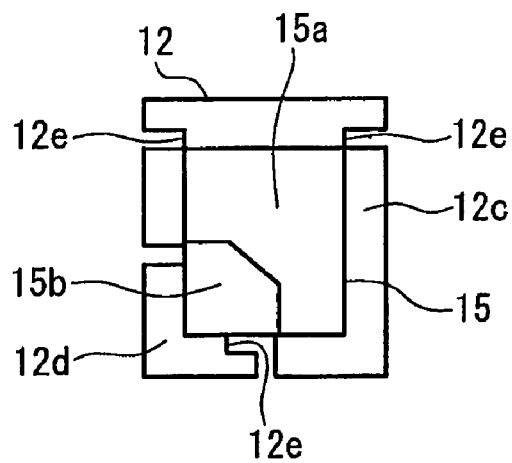
FIG. 8B is a plan view of the mount portion of FIG. 8A, on which a LED chip is mounted.
Figure 8C:
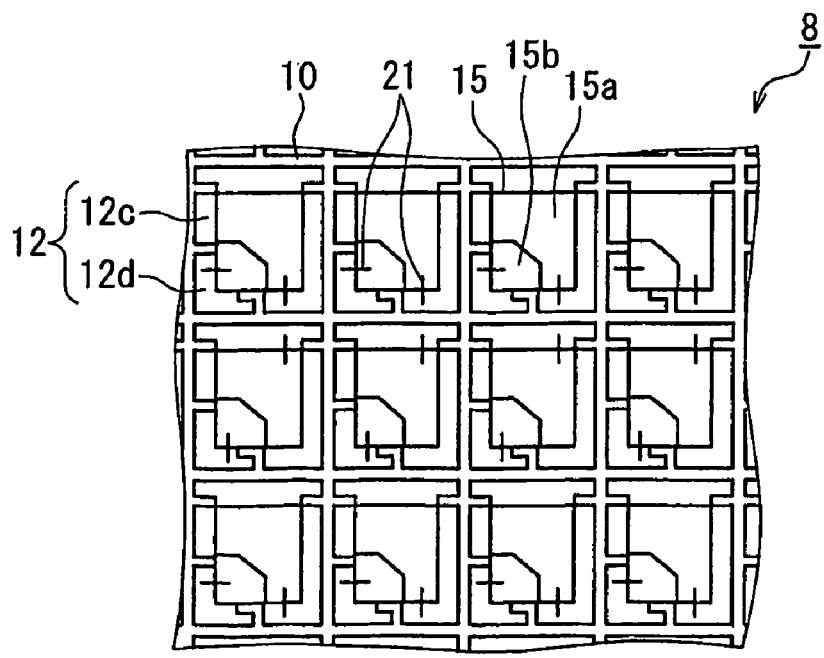
FIG. 8C is a plan view of the light-emitting module of Embodiment 8, as viewed perpendicularly to a mounting board.
Figure 9A:
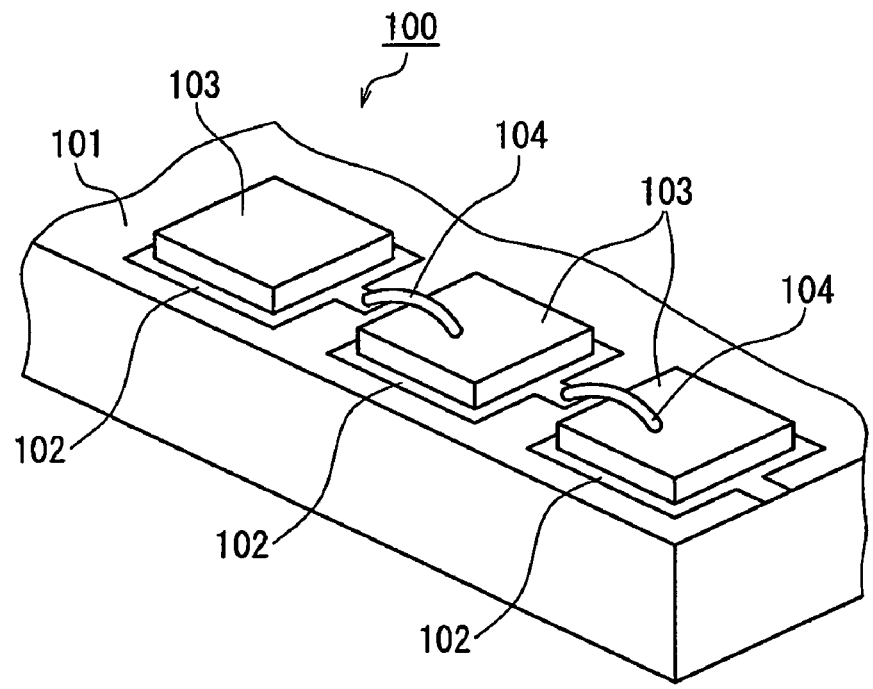
FIG. 9A is a schematic perspective view of a conventional LED light source.
Figure 9B:
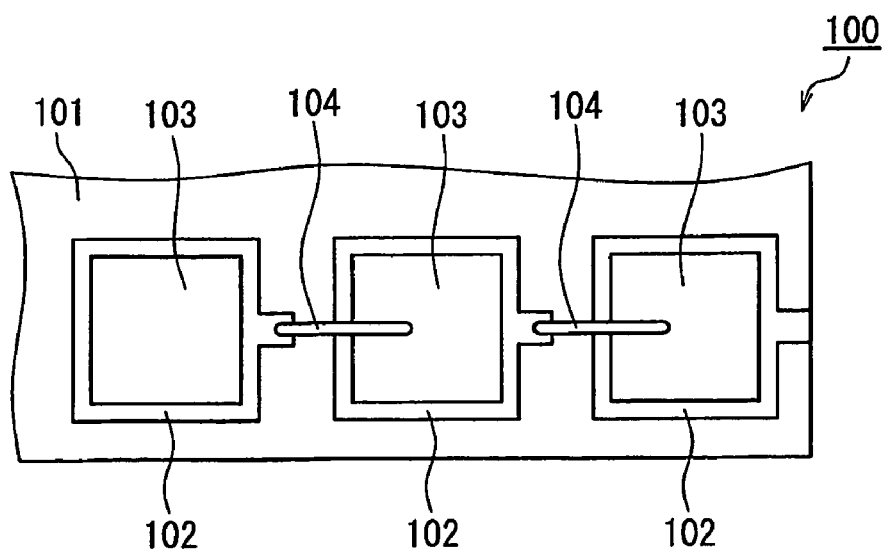
FIG. 9B is a schematic plan view of the conventional LED light source.

A light-emitting module of Embodiment 8 of the present invention will be described by referring to the drawings. FIG. 8A is a plan view of a mount portion included in the light-emitting module of Embodiment 8. FIG. 8B is a plan view of the mount portion of FIG. 8A, on which a LED chip is mounted. FIG. 8C is a plan view of the light-emitting module of Embodiment 8, as viewed perpendicularly to a mounting board. In FIGS. 8A to 8C, the same components as those in FIGS. 5A and 5B are denoted by the same reference numerals, and the explanation will not be repeated.

As shown in FIG. 8A, the mount portion 12 of the light-emitting module 8 (see FIG. 8C) includes a first terminal 12c and a second terminal 12d. Both the first and second terminals 12c, 12d have notches 12e that correspond to predetermined portions of the outer edge of the LED chip 15. By using the notches 12e as positioning marks, the LED chip 15 can be mounted in the center of the mount portion 12, as shown in FIG. 8B. In the mount portion 12 of FIG. 8B, the portions beyond each side of the LED chip 15 can be identified as "peripheral portions".

As shown in FIGS. 8B and 8C, a first electrode 15a and a second electrode 15b are formed on the upper surface of the LED chip 15. The first electrode 15a is connected electrically to the first terminal 12c via the wire 21, and the second electrode 15b is connected electrically to the second terminal 12d via the wire 21, as shown in FIG. 8C Like the light-emitting modules 2 to 7, the extending direction of each of the wires 21 is oriented irregularly in the light-emitting module 8. Accordingly, the light-emitting module 8 also can prevent the shadows of the wires 21 from overlapping, and thus can suppress the luminance nonuniformity.

INDUSTRIAL APPLICABILITY

A light-emitting module of the present invention is suitable for a lighting unit used, e.g., in general lighting applications, lighting for presentation purposes (such as a sign light), or vehicle lighting (particularly a headlight) or a display unit used, e.g., in outdoor large display screens or projectors.

The invention claimed is:

1. A light-emitting module comprising:
   a mounting board with a conductor pattern; and
   a plurality of light-emitting elements mounted on the conductor pattern via wires,
   wherein each of the wires extends from an edge of the light-emitting element to the conductor pattern when viewed perpendicularly to the mounting board,
   wherein an extending direction of each of the wires toward the conductor pattern is oriented irregularly when viewed perpendicularly to the mounting board.

2. The light-emitting module according to claim 1, comprising a plurality of light-emitting units, each unit comprising a plurality of light-emitting elements connected in series via the wires and the conductor pattern,
   wherein the light-emitting units are arranged in parallel on the mounting board, and
   the adjacent light-emitting units differ in the extending direction of each of the wires.

3. The light-emitting module according to claim 2, wherein all the wires in the same light-emitting unit extend in the same direction.

4. The light-emitting module according to claim 1, wherein the wires used for mounting each of the adjacent light-emitting elements extend in different directions.

5. The light-emitting module according to claim 1, wherein the wires have a diameter of 30 μm or less.

* * * * *